US010315212B2

(12) United States Patent
Hsu

(10) Patent No.: US 10,315,212 B2
(45) Date of Patent: Jun. 11, 2019

(54) ROTARY SPRAYING COATING SYSTEM AND ITS FIXTURE

(71) Applicant: Primax Electronics Ltd., Taipei (TW)

(72) Inventor: Chih-Hao Hsu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 15/834,898

(22) Filed: Dec. 7, 2017

(65) Prior Publication Data

US 2019/0022685 A1 Jan. 24, 2019

(30) Foreign Application Priority Data

Jul. 21, 2017 (TW) .............................. 106124634 A

(51) Int. Cl.
| | |
|---|---|
| *B05B 13/02* | (2006.01) |
| *B05C 11/02* | (2006.01) |
| *H01L 21/67* | (2006.01) |
| *H01L 21/677* | (2006.01) |
| *B05B 9/04* | (2006.01) |
| *H01L 21/56* | (2006.01) |

(52) U.S. Cl.
CPC ........ *B05B 13/0242* (2013.01); *B05C 11/028* (2013.01); *H01L 21/6715* (2013.01); *H01L 21/6776* (2013.01); *B05B 9/0423* (2013.01); *H01L 21/56* (2013.01); *H01L 21/67288* (2013.01)

(58) Field of Classification Search
USPC ...................... 118/52, 612, 56, 319, 320, 500
See application file for complete search history.

(56) References Cited

U.S. PATENT DOCUMENTS

| 4,903,819 A * | 2/1990 | Heinold ................. B65G 47/61 |
| | | 198/465.4 |
| 6,436,189 B1 * | 8/2002 | Reuscher ............... B05D 1/002 |
| | | 118/319 |
| 2016/0303487 A1 * | 10/2016 | Ayers ................... A63H 33/105 |

* cited by examiner

*Primary Examiner* — Yewebdar T Tadesse
(74) *Attorney, Agent, or Firm* — Muncy, Geissler, Olds & Lowe, P.C.

(57) ABSTRACT

The present invention provides a rotary spraying coating system, configured to evenly form a paint on a surface of a chip connecting plate. The system includes: a plurality of fixtures, where each has a pedestal, an abutting piece, and a rotating axis, and the abutting piece is configured to abut and fix the chip connecting plate to the pedestal, to avoid warping of the chip connecting plate; a conveyor belt, configured to convey the fixtures, wherein the fixtures are connected to the conveyor belt by using the rotating axis and rotate with the rotating axis as an axis center; at least one spraying coating apparatus, configured to spray and coat the paint on the surface of the chip connecting plate; and a control module, configured to control a rotational speed of the fixtures, a movement speed of the conveyor belt, and a spraying coating amount of the at least one spraying coating apparatus.

11 Claims, 6 Drawing Sheets

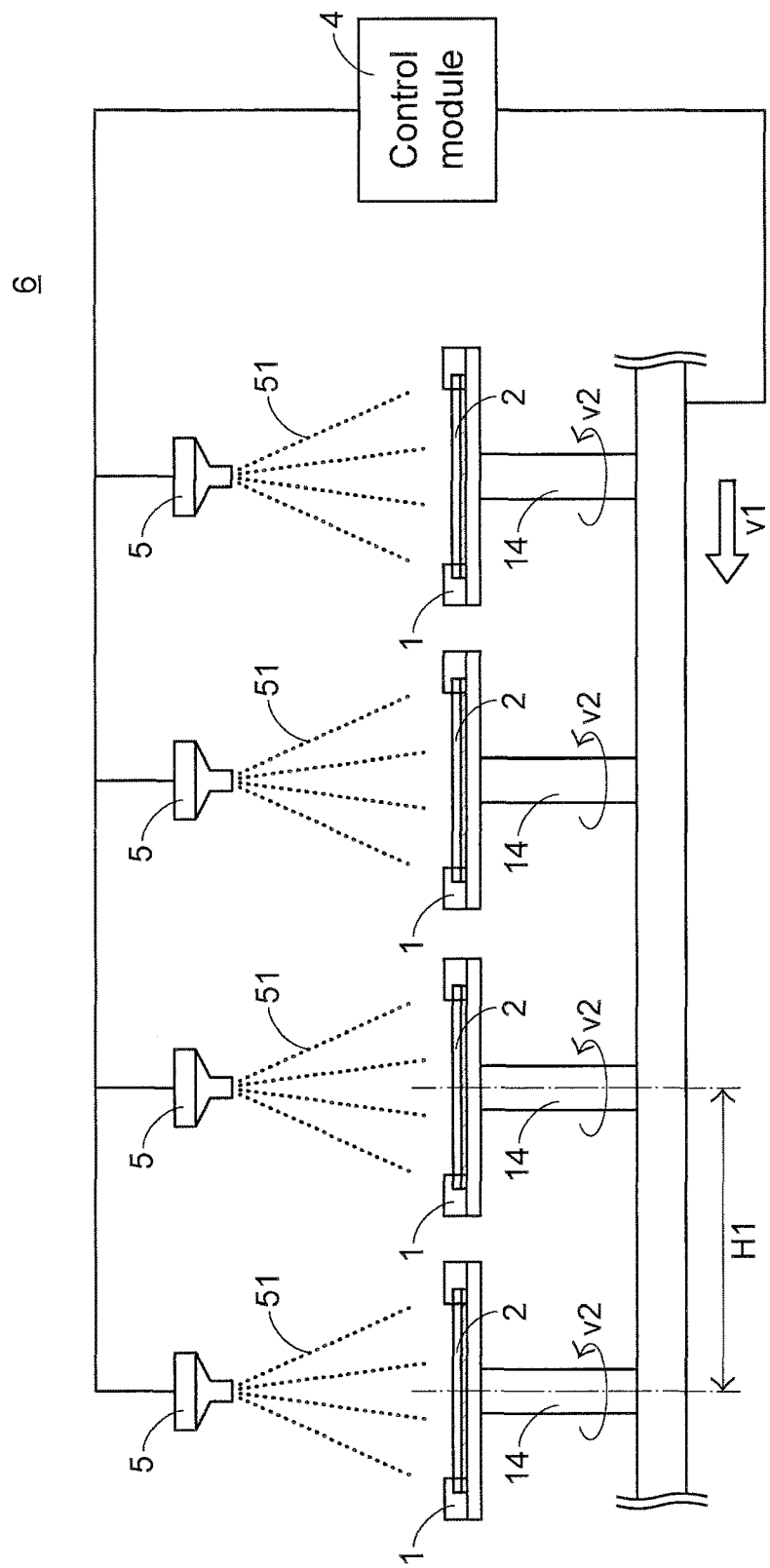

ROTARY SPRAYING COATING SYSTEM AND ITS FIXTURE

FIELD OF THE INVENTION

The present invention relates to the application field of a spraying coating process, and more specifically to a rotary spraying coating system used for film formation of a workpiece.

BACKGROUND OF THE INVENTION

With the progress of science and technologies, a biology recognition function such as iris recognition, fingerprint recognition, face recognition, or voice recognition also starts to be applied to an electronic apparatus. A fingerprint recognition module with a fingerprint recognition function has been widely applied to an electronic apparatus, and has become one of standard configurations. A user may recognize an identity by using the fingerprint recognition module, to further unlock an electronic apparatus or operate a software interface.

The fingerprint recognition module includes a fingerprint sensing unit and a protective layer covered on the fingerprint sensing unit. When a user presses the protective layer by fingers, the fingerprint sensing unit may detect a fingerprint in contact with a surface of the protective layer.

In the known technology, the protective layer is generally formed by spraying and coating, by using a spraying coating apparatus, a paint on a chip connecting plate including a plurality of sensing chips, and then solidifying the paint by baking and heating or by means of exposure to ultraviolet light. Therefore, after a manufacture procedure of spraying and coating of the paint, baking and heating, or exposure to ultraviolet light is repeated for many times, a protective layer of a single layer or multiple layers may be formed on a surface of the chip connecting plate.

After the protective layer is formed, the chip connecting plate may be cut by using a laser, to generate a single fingerprint recognition module. To avoid uneven painting and coating on the surface of the chip connecting plate, before the paint is sprayed and coated, generally, the entire chip connecting plate is cut in half first, and then the manufacture procedure of spraying and coating the paint, baking and heating, or exposure to ultraviolet light is performed. However, after the chip connecting plate is baked and heated or exposed to ultraviolet light for many times, a difference of internal materials of the chip connecting plate may cause a difference in contractions, further causing a warping phenomenon of the appearance of the chip connecting plate. The warping phenomenon easily causes an uneven thickness of the formed protective layer or an uneven surface of the protective layer. In another aspect, when a manufacture procedure of spraying and coating the paint is performed, the warped chip connecting plate may also make the paint unevenly distributed on the surface of the chip connecting plate.

In view of this, how to provide a spraying coating system that enables a paint evenly distributed on a surface of the chip connecting plate and can effectively reduce a warping possibility of the chip connecting plate is the technical topic to be resolved in the present invention.

SUMMARY OF THE INVENTION

A main objective of the present invention is to provide a rotary spraying coating system and a fixture that may avoid warping of a chip connecting plate, so that a sprayed and coated paint may be evenly distributed on a surface of the chip connecting plate.

To achieve the above objective, the present invention provides a rotary spraying coating system, configured to evenly form a paint on a surface of a chip connecting plate, where the system includes:

a plurality of fixtures, where each has a pedestal, an abutting piece, and a rotating axis, and the abutting piece is configured to abut and fix the chip connecting plate to the pedestal, to avoid warping of the chip connecting plate;

a conveyor belt, configured to convey the fixtures, where the fixtures are connected to the conveyor belt by using the rotating axis and rotate with the rotating axis as an axis center;

at least one spraying coating apparatus, configured to spray and coat the paint on the surface of the chip connecting plate; and a control module, configured to control a rotational speed of the fixtures, a movement speed of the conveyor belt, and a spraying coating amount of the at least one spraying coating apparatus.

In the above preferable implementation, the pedestal has at least one notch, configured to extract a chip connecting plate.

In the above preferable implementation, the abutting piece is an abutting bar or an abutting frame.

In the above preferable implementation, the pedestal further includes an adhesive layer, and the adhesive layer is used to adhere and fix the chip connecting plate, to avoid warping of the chip connecting plate.

In the above preferable implementation, a length of the pedestal is 120 mm, and a width is 90 mm.

In the above preferable implementation, distances between the axis centers of the fixtures are 152 mm.

In the above preferable implementation, the rotational speed is 24 revolutions per second.

In the above preferable implementation, the movement speed is 5 meters per minute.

The other preferable manner of the present invention is about a fixture, configured to fasten a chip connecting plate, where the fixture includes:

a pedestal;

an abutting piece; and a rotating axis, where the abutting piece is configured to abut and fix the chip connecting plate to the pedestal, to avoid warping of the chip connecting plate, and the fixtures may rotate with the rotating axis as an axis center.

In the above preferable implementation, the pedestal has at least one notch, configured to extract the chip connecting plate.

In the above preferable implementation, the abutting piece is an abutting bar or an abutting frame.

In the above preferable implementation, the pedestal further includes an adhesive layer, configured to adhere and fix the chip connecting plate, to avoid warping of the chip connecting plate.

In the above preferable implementation, a length of the pedestal is 120 mm, and a width is 90 mm.

BRIEF DESCRIPTION OF THE DRAWINGS

FIG. 5 is a rotary spraying coating system according to the present invention.

DETAILED DESCRIPTION OF THE PREFERRED EMBODIMENT

Advantages and features of the present invention and a method for achieving them are more easily understood in more detailed description with reference to exemplary embodiments and the accompanying drawings. However, the present invention may be implemented in different forms and it should not be understood as only limited to the embodiments described herein. On the contrary, for a person of ordinary skilled in the art, the provided embodiments make this disclosure express the scope of the present invention more thoroughly, fully, and completely.

Figure 1A:
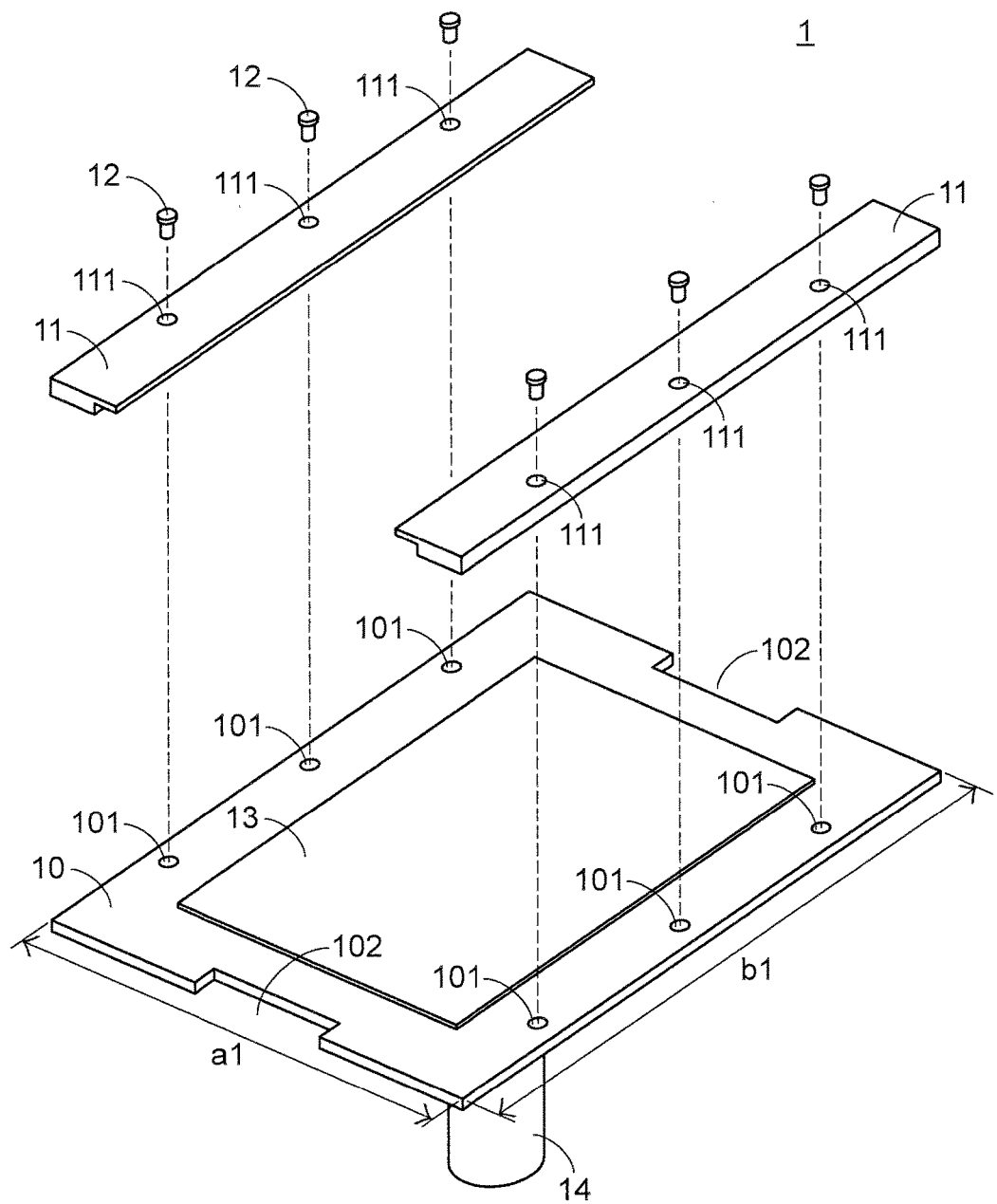
FIG. 1A is an exploded view of a fixture according to a first embodiment of the present invention.

First, referring to FIG. 1A, FIG. 1A is an exploded view of a fixture according to a first embodiment of the present invention. In FIG. 1A, the fixture 1 includes: a pedestal 10, an abutting piece 11, a plurality of screws 12, an adhesive layer 13, and a rotating axis 14. A width a1 of the pedestal 10 is 90 mm, and a length b1 is 120 mm, and a distance of a diagonal of a bearing surface of the pedestal 10 is not greater than 150 mm. The adhesive layer 13 is a heat-resistant double faced adhesive tape, the adhesive layer 13 can still keep some viscosity in a high temperature environment, and the adhesive layer 13 is disposed on the bearing surface of the pedestal 10. A plurality of first screw holes 101 is disposed on two sides relative to the bearing surface of the pedestal 10. The abutting piece 11 is an abutting bar, and a plurality of second screw holes 111 corresponding to the first screw hole 101 is disposed on the abutting piece 11. The screw 12 may penetrate the second screw hole 111 and be locked in the first screw hole 101, so that the abutting piece 11 may be fixed on the bearing surface of the pedestal 10. The rotating axis 14 is disposed on the other surface relative to the bearing surface, and the rotating axis 14 is located at the center of the gravity of the fixture 1, so that the pedestal 10 may rotate stably with the rotating axis 14 as an axis center. In addition, the rotating axis 14 may be connected to the pedestal 10 in a welding or locking manner. Although the present invention only provides an implementation of locking an abutting piece to a pedestal by using a screw, in actual application, an abutting piece may also be fixed on a bearing surface of the pedestal in a clamping, buckling, or gluing manner. This is not limited to the implementations of the present invention.

Figure 1B:
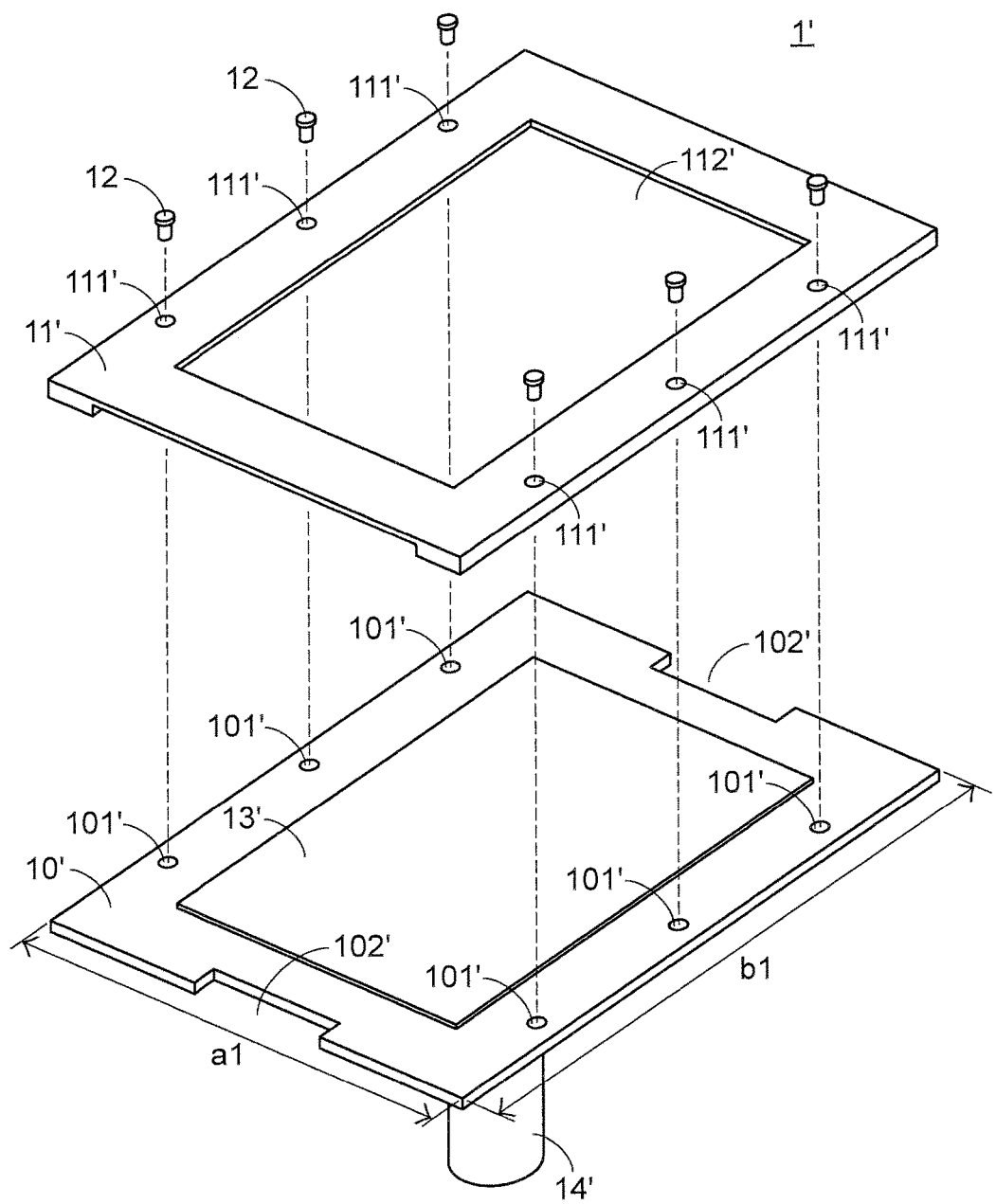
FIG. 1B is an exploded view of a fixture according to a second embodiment of the present invention.

Referring to FIG. 1B, FIG. 1B is an exploded view of a fixture according to a second embodiment of the present invention. In FIG. 1B, a pedestal 10', a plurality of screws 12', an adhesive layer 13', a rotating axis 14', a plurality of first screw holes 101', a width a1, and a length b1 of a fixture 1' are the same to those in FIG. 1A, and are not described herein again. The only difference lies in: The abutting piece 11' is an abutting frame, the abutting piece 11' has an opening 112' and a plurality of second screw holes 111' corresponding to the first screw hole 101', and the screw 12' may penetrate the second screw hole 111' and be locked in the first screw hole 101', so that the abutting piece 11' may be fixed on a bearing surface of the pedestal 10'.

Figure 2:
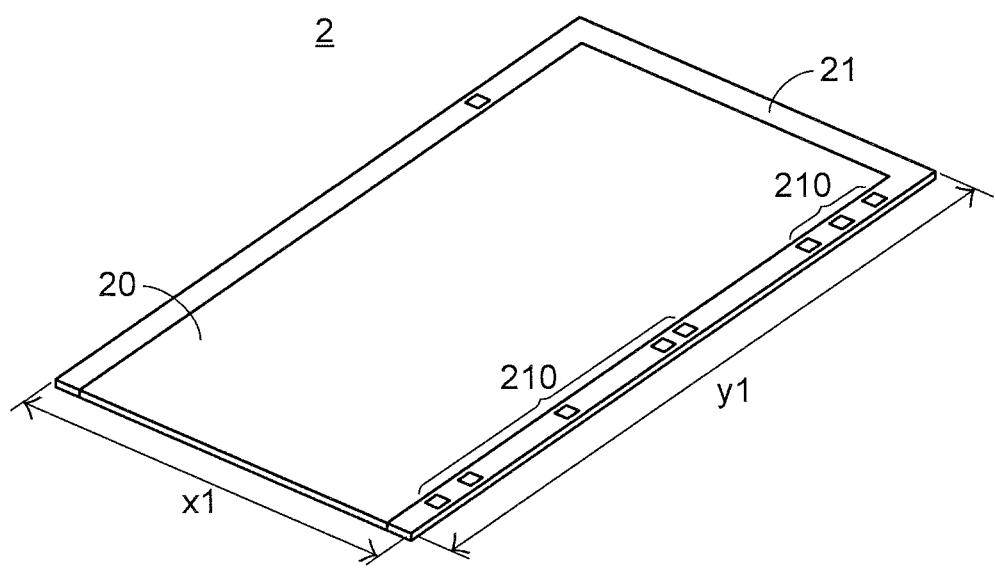
FIG. 2 is a schematic view of a chip connecting plate according to the present invention.

Referring to FIG. 2, FIG. 2 is a schematic view of a chip connecting plate according to the present invention. In FIG. 2, the chip connecting plate 2 has a chip area 20 and a border 21. A material of the chip area 20 is an Epoxy Molding Compound (EMC), and the inside of the chip area 20 includes a plurality of fingerprint sensing chips (not shown in the figure) encapsulated by using a Land Grid Array (LGA) technology. A plurality of locating points 210 is disposed on the border 21, and the locating points 210 are used to indicate cutting positions of a laser. After at least one protective layer is formed on the surface of the chip connecting plate 2, the chip connecting plate 2 may be cut according to the positions of the locating points 210 by using a laser, to form at least one fingerprint sensing module.

Figure 3A:
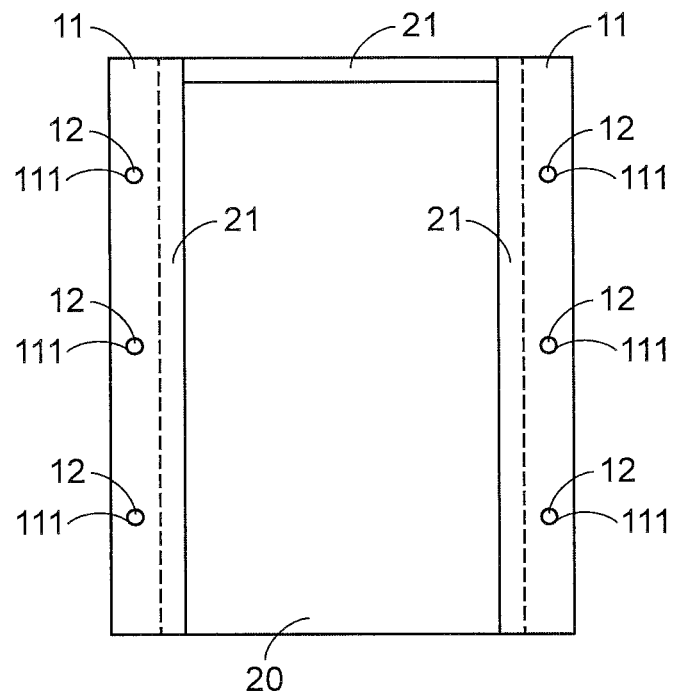
FIG. 3A is a top view of a fixture-fixed chip connecting plate according to a first embodiment of the present invention.
Figure 3B:
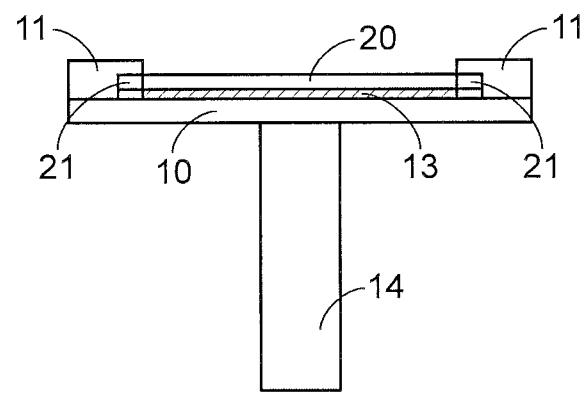
FIG. 3B is a sectional view of a fixture-fixed chip connecting plate according to a first embodiment of the present invention.

Referring to both FIG. 3A and FIG. 3B, FIG. 3A is a top view of a fixture-fixed chip connecting plate according to a first embodiment of the present invention. FIG. 3B is a sectional view of a fixture-fixed chip connecting plate according to a first embodiment of the present invention. In FIG. 3A, the abutting piece 11 is an abutting bar, and the abutting piece 11 may penetrate the screw 12 of the second screw hole 111 and be locked on the bearing surface of the pedestal 10 (as shown in FIG. 3B). In this case, the abutting piece 11 is abutted and placed on the chip connecting plate 2 on the bearing surface of the pedestal 10, and is covered on a block of the border 21 of the chip connecting plate 2, so that the chip connecting plate 2 may be fixed on the bearing surface of the pedestal 10. Still referring to FIG. 3B, in FIG. 3B, the chip area 20 of the chip connecting plate 2 is adhered on the adhesive layer 13. The abutting piece 11 is abutted on the block of the border 21 of the chip connecting plate 2, and the chip area 20 of the chip connecting plate 2 is adhered by using the adhesive layer 13, so that a warping phenomenon generated after the chip connecting plate 2 is baked and heated or exposed to ultraviolet light can be effectively avoided. In another aspect, the abutting piece 11 is covered on the block of the border 21 of the chip connecting plate 2. Therefore, in a process of spraying and coating a paint, the paint is not sprayed and coated on the locating point 210 (as shown in FIG. 2), so that a situation of subsequent laser cutting affected due to defects of the locating point 210 can be avoided.

Figure 4A:
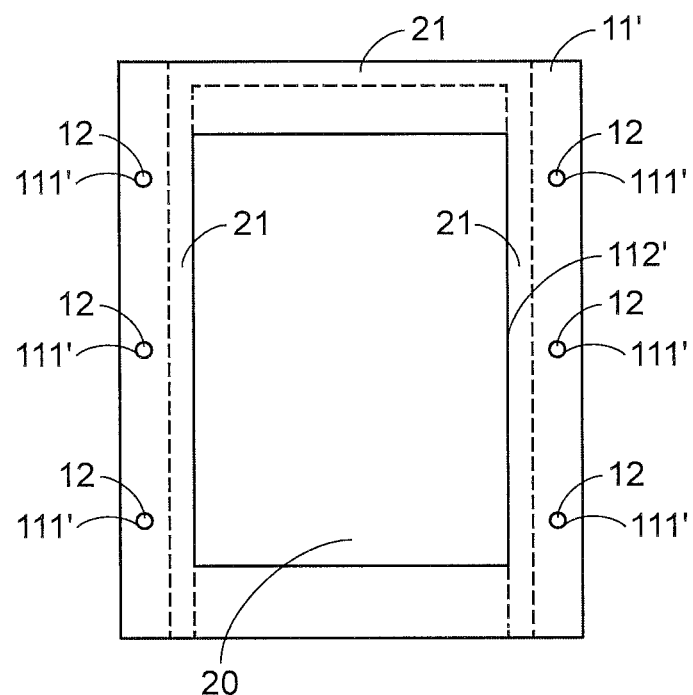
FIG. 4A is a top view of a fixture-fixed chip connecting plate according to a second embodiment of the present invention.
Figure 4B:
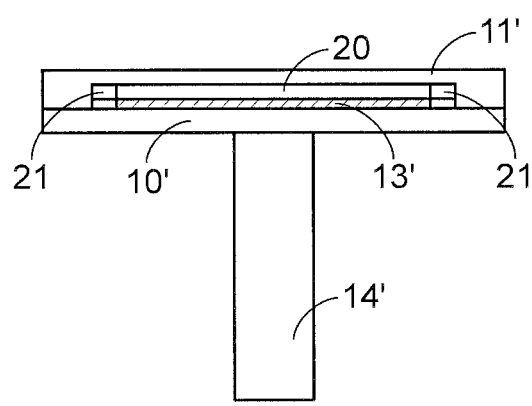
FIG. 4B is a sectional view of a fixture-fixed chip connecting plate according to a second embodiment of the present invention.

Referring to both FIG. 4A and FIG. 4B, FIG. 4A is a top view of a fixture-fixed chip connecting plate according to a second embodiment of the present invention. FIG. 4B is a sectional view of a fixture-fixed chip connecting plate according to a second embodiment of the present invention. In FIG. 4A, the abutting piece 11' is an abutting frame, and the abutting piece 1F may penetrate the screw 12' of the second screw hole 111' and be locked on the bearing surface of the pedestal 10' (as shown in FIG. 4B). In this case, the abutting piece 11' is abutted and placed on the chip connecting plate 2 of the bearing surface, and is covered on blocks of four sides of the chip connecting plate 2, so that the chip connecting plate 2 may be fixed on the bearing surface of the pedestal 10', and the chip area 20 of the chip connecting plate 2 is exposed to the position of the opening 112', to facilitate a subsequent spraying coating procedure. Still referring to FIG. 4B, in FIG. 4B, the chip area 20 of the chip connecting plate 2 is adhered to the adhesive layer 13'.

The abutting piece 11' is abutted on the blocks of the four sides of the chip connecting plate 2, and the chip area 20 of the chip connecting plate 2 is adhered by using the adhesive layer 13', so that a warping phenomenon generated after the chip connecting plate 2 is baked and heated or exposed to ultraviolet light can be effectively avoided. In another aspect, the blocks of the four sides covered by the abutting piece 11' include the border 21. Therefore, in a process of spraying and coating a paint, the paint is not sprayed and coated on the locating point 210 (as shown in FIG. 2), so that a situation of subsequent laser cutting affected due to defects of the locating point 210 can be avoided.

Referring to FIG. 5, FIG. 5 is a rotary spraying coating system according to the present invention. In FIG. 5, the rotary spraying coating system 6 includes: a plurality of fixtures 1, a conveyor belt 3, a control module 4, and at least one spraying coating apparatus 5. The fixture 1 is configured to abut and fix the chip connecting plate 2, to avoid a warping phenomenon generated due to different contractions of materials in a process of baking and heating the chip connecting plate 2 or exposing the chip connecting plate 2 to ultraviolet light. Certainly, the abutting bar of the fixture 1 (as shown in FIG. 1A) may also be replaced with an abutting frame of the fixture 1' (as shown in FIG. 1B). The conveyor belt 3 is configured to convey the fixture 1 and a movement speed of the conveyor belt 3 is v1. The fixture 1 may be connected to the conveyor belt 3 by using the rotating axis 14, and each fixture 1 may rotate with the rotating axis 14 as an axis center and with a rotational speed v2. In another aspect, a distance H1 between axis centers of the fixtures 1 is equal to or greater than 152 mm, to avoid mutual interference between the fixtures 1. The spraying coating apparatus 5 above the fixture 1 is configured to spray a paint 51 on the surface of the chip connecting plate 2. An angle between the spraying coating apparatus 5 and the horizontal line and a distance between the spraying coating apparatus 5 and the chip connecting plate 2 may be adjusted manually or automatically. In a preferable implementation, the angle between the spraying coating apparatus 5 and the horizontal line is between 20 degrees and 90 degrees. The distance between the spraying coating apparatus 5 and the chip connecting plate 2 is between 15 cm and 30 cm. The control module 4 is configured to control and adjust the rotational speed v2 of the fixtures 1, a movement speed v1 of the conveyor belt 3, and a spraying coating amount of the paint 51 of the spraying coating apparatus 5. In a preferable implementation, the rotational speed v2 of the fixture 1 is 24 revolutions per second, and the movement speed v1 of the conveyor belt 3 is 5 meters per minute.

Still referring to FIG. 5, for the chip connecting plate 2 on the fixture 1, a centrifugal force generated during rotation of the fixture 1 may be used to enable the paint 51 sprayed by the spraying coating apparatus 5 to be evenly distributed on the surface of the chip connecting plate 2, and the centrifugal force may be used to throw away the extra paint 51 on the surface of the chip connecting plate 2. When the paint 51 is sprayed and coated completely, and a manufacture procedure of baking and heating the chip connecting plate 2 or exposing the chip connecting plate 2 to ultraviolet light needs to be performed, the abutting piece 11 or 11' (as shown in FIG. 1A and FIG. 1B) may be abutted and covered on the block of the border 21 of the chip connecting plate 2, and the adhesive layer 13 or 13' (as shown in FIG. 3B and FIG. 4B) is adhered to the chip area 20 of the chip connecting plate 2, so that the chip connecting plate 2 may keep an even state. In this way, a warping phenomenon generated due to different contractions of materials of the chip connecting plate 2 after the chip connecting plate 2 is baked and heated or exposed to ultraviolet light can be effectively avoided.

Compared with the known technology, the present invention provides a rotary spraying coating system that may evenly distribute a paint on a surface of a chip connecting plate. In another aspect, abutting and adhering the chip connecting plate by using an abutting piece and an adhesive layer on a fixture not only may fix the chip connecting plate to keep an even plat state, but also may effectively avoid a warping phenomenon generated due to different contractions of materials of the chip connecting plate after the chip connecting plate is baked and heated or exposed to ultraviolet light. Therefore, the present invention actually is a creation with a high industrial value.

All sorts of modifications can be made to the present invention by a person skilled in the art, without departing from the protection scope of the appended claims.

What is claimed is:

1. A rotary spraying coating system, configured to evenly form a paint on a surface of a chip connecting plate, wherein the system comprises:
   a plurality of fixtures, wherein each has a pedestal, an abutting piece, and a rotating axis, and the abutting piece is configured to abut and fix the chip connecting plate to the pedestal, to avoid warping of the chip connecting plate;
   a conveyor belt, configured to convey the fixtures, wherein the fixtures are connected to the conveyor belt by using the rotating axis and rotate with the rotating axis as an axis center;
   at least one spraying coating apparatus, configured to spray and coat the paint on the surface of the chip connecting plate; and
   a control module, configured to control a rotational speed of the fixtures, a movement speed of the conveyor belt, and a spraying coating amount of the at least one spraying coating apparatus;
   wherein the pedestal further comprises an adhesive layer, and the adhesive layer is used to adhere and fix the chip connecting plate, to avoid warping of the chip connecting plate.

2. The rotary spraying coating system according to claim 1, wherein the pedestal has at least one notch, configured to extract the chip connecting plate.

3. The rotary spraying coating system according to claim 1, wherein the abutting piece is an abutting bar or an abutting frame.

4. The rotary spraying coating system according to claim 1, wherein a length of the pedestal is 120 mm, and a width is 90 mm.

5. The rotary spraying coating system according to claim 1, wherein distances between the axis centers of the fixtures are 152 mm.

6. The rotary spraying coating system according to claim 1, wherein the rotational speed is 24 revolutions per second.

7. The rotary spraying coating system according to claim 1, wherein the movement speed is 5 meters per minute.

8. A fixture, configured to fasten a chip connecting plate, wherein the fixture comprises:
   a pedestal;
   an abutting piece; and
   a rotating axis, wherein
   the abutting piece is configured to abut and fix the chip connecting plate to the pedestal, to avoid warping of the chip connecting plate, and the fixture may rotate with the rotating axis as an axis center;

wherein the pedestal further comprises an adhesive layer, configured to adhere and fix the chip connecting plate, to avoid warping of the chip connecting plate.

9. The fixture according to claim 8, wherein the pedestal has at least one notch, configured to extract the chip connecting plate.

10. The fixture according to claim 8, wherein the abutting piece is an abutting bar or an abutting frame.

11. The fixture according to claim 8, wherein a length of the pedestal is 120 mm, and a width is 90 mm.

* * * * *